(12) United States Patent
Smith et al.

(10) Patent No.: US 7,085,137 B2
(45) Date of Patent: Aug. 1, 2006

(54) CARD MOUNTING APPARATUS

(75) Inventors: Peter Andrew Smith, Cary, NC (US); Brian Michael Kerrigan, Cary, NC (US); Michael Sven Miller, Raleigh, NC (US); Paul Andrew Wormsbecher, Apex, NC (US); John Gary Bulluck, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/882,138

(22) Filed: Jun. 30, 2004

(65) Prior Publication Data

US 2006/0002095 A1    Jan. 5, 2006

(51) Int. Cl.
*H05K 7/16* (2006.01)
(52) U.S. Cl. .................. 361/752; 361/730; 361/796; 361/755; 439/76.1; 439/79; 439/377
(58) Field of Classification Search ................ 361/728, 361/730, 752, 796, 800, 736, 755, 756; 174/50, 174/52.1; 439/76.1, 78, 79, 377
See application file for complete search history.

(56) References Cited

U.S. PATENT DOCUMENTS

| | | | | |
|---|---|---|---|---|
| 5,657,204 A | * | 8/1997 | Hunt | 361/752 |
| 5,868,585 A | * | 2/1999 | Barthel et al. | 439/377 |
| 6,406,322 B1 | * | 6/2002 | Barringer et al. | 439/377 |
| 6,460,098 B1 | * | 10/2002 | Paul | 710/62 |
| 6,529,383 B1 | * | 3/2003 | Barringer et al. | 361/754 |
| 6,597,581 B1 | * | 7/2003 | Barringer et al. | 361/756 |
| 6,606,255 B1 | * | 8/2003 | Barringer et al. | 361/807 |
| 6,608,759 B1 | * | 8/2003 | Barringer et al. | 361/759 |
| 6,671,181 B1 | | 12/2003 | Kaminski | |
| 6,678,162 B1 | | 1/2004 | Chewning | |
| 6,709,279 B1 | | 3/2004 | Uratsuji | |
| 6,743,054 B1 | * | 6/2004 | Wu | 439/638 |
| 6,822,878 B1 | * | 11/2004 | Dobbs et al. | 361/807 |
| 6,840,801 B1 | * | 1/2005 | Behl | 439/541.5 |

* cited by examiner

*Primary Examiner*—Kamand Cuneo
*Assistant Examiner*—Dameon E. Levi
(74) *Attorney, Agent, or Firm*—Martin J. McKinley; Dillon & Yudell LLP

(57) ABSTRACT

An apparatus for providing multi-directional signaling interface connection of a printed circuit card within a computer chassis. In one embodiment, a blind swap cartridge carries a circuit card that includes a first signaling interface connector in the form of a PCI edge connector. The edge connector is movable via a pivot point on the cartridge in a substantially transverse direction with respect to an insertion direction of said blind swap cartridge. In accordance with the present invention, a second signaling interface connector, such as a SCSI connector, is rigidly affixed to the exterior of the blind swap cartridge. The second signaling interface connector is preferably disposed on the cartridge in an orientation such that its connection direction is substantially aligned with the blind swap cartridge insertion direction. A flexible interconnect member is preferably utilized to couple the second signaling interface connector to the circuit card.

11 Claims, 4 Drawing Sheets

CARD MOUNTING APPARATUS

BACKGROUND OF THE INVENTION

1. Technical Field

The present invention relates generally to packaging electronic circuit components and in particular to securing printed circuit cards within a computer system chassis. More particularly, the present invention relates to a cartridge packaging apparatus for mechanically mounting and electronically coupling a printed circuit card having at least two bus signaling interfaces.

2. Description of the Related Art

The increased dependency on high-capacity processor based systems has resulted in a need for such systems to be serviced while performing regular functions. A typical computer system includes a system planar having multiple access ports adapted to receive computer modules to expand the capacity and functionality of the computer. For high-end mainframe applications in which individualized installation and removal of printed circuit cards presents significant logistical obstacles, so called blind dock cartridges are commonly utilized to facilitate convenient installation and removal (i.e. blind swapping) of cards into access ports. A blind dock or blind swap cartridge is generally a carrier device for the card in which the card connection direction is transverse to the direction of cartridge insertion into the chassis. The card is contained within the cartridge carrier which is then inserted and seated into position within a rack or chassis bay. Thereafter, an ejection lever for the carrier holding the card is actuated, seating the card into the associated connector of the access port. One problem associated with such cartridge handling of printed circuit cards arises when the object card requires more than one cable interconnect such as when the card is a multi-function card having more than one signaling interface. For example, it is increasingly common for a PCI card to include onboard applications requiring at least one other system interconnect such as a Small Computer System Interconnect (SCSI) interconnect.

Such additional interconnections pose problems in the context of a highly compact modularized chassis mounting apparatus. Additional chassis cable connections coupled to or within a cartridge would interfere with the cartridge placement thus defeating the purpose of the cartridge as a convenient card placement forum. An alternate approach that avoids additional cable connectors from the chassis to the cartridge entails replacing the primary connector, such as a PCI edge connector, with a connector accommodating the one or more additional signaling interfaces. Such an approach would require designing non-standardized interconnects having and the higher contact density.

As manufacturers continually to strive to develop higher-capacity computer systems having increased functionality and flexibility and reduced size, the consequent need for efficient mounting of multi-function cards grows accordingly. Therefore, a need exists for a printed circuit card mounting apparatus enabling a card having more than one external signaling interface to be conveniently mounted within a computer chassis. The present invention addresses such a need.

SUMMARY OF THE INVENTION

An apparatus for providing multi-directional signaling interface connection of a printed circuit card within a computer chassis is disclosed herein. In one embodiment, a blind swap cartridge carries a circuit card that includes a first signaling interface connector in the form of a PCI edge connector. The edge connector is movable via a pivot point on the cartridge in a substantially transverse direction with respect to an insertion direction of said blind swap cartridge. In accordance with the present invention, a second signaling interface connector, such as a SCSI connector, is rigidly affixed to the exterior of the blind swap cartridge. The second signaling interface connector is preferably disposed on the cartridge in an orientation such that its connection direction is substantially aligned with the blind swap cartridge insertion direction. A flexible interconnect member is preferably utilized to couple the second signaling interface connector to the circuit card.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT(S)

In general, the present invention seeks to solve a number of problems relating to circuit card mounting and signaling connection within a computer chassis. In particular, it is desirable to employ printed circuit cards within a large-scale computer chassis wherein the cards are included within so-called blind swap cartridges that can be mounted within the chassis in a compact manner enabling convenient insertion and removal access thereto while providing at least two signaling interface connections. As utilized herein a "cartridge" is a carrying device for inserting and/or removing printed circuit cards from an appropriate access port or bay within a chassis. A "blind swap cartridge" is characterized as a carrier for the card in which the connection direction (i.e. direction in which the printed circuit card connector engages a backplane connector) is transverse to the direction in which the cartridge is inserted in the chassis bay.

Some circuit cards deployed within blind swap cartridges, such as PCI cards are increasingly designed to have multiple signaling interface functions. For example, SCSI (Small Computer System Interconnect) interfacing is often including on such PCI cards resulting in the need for a SCSI signaling interconnect from the PCI card to a chassis backplane. As explained in further detail with reference to the figures, the present invention provides a card mounting apparatus providing multiple signaling interface connectivity particularly well-suited for blind swap cartridges.

Figure 1:
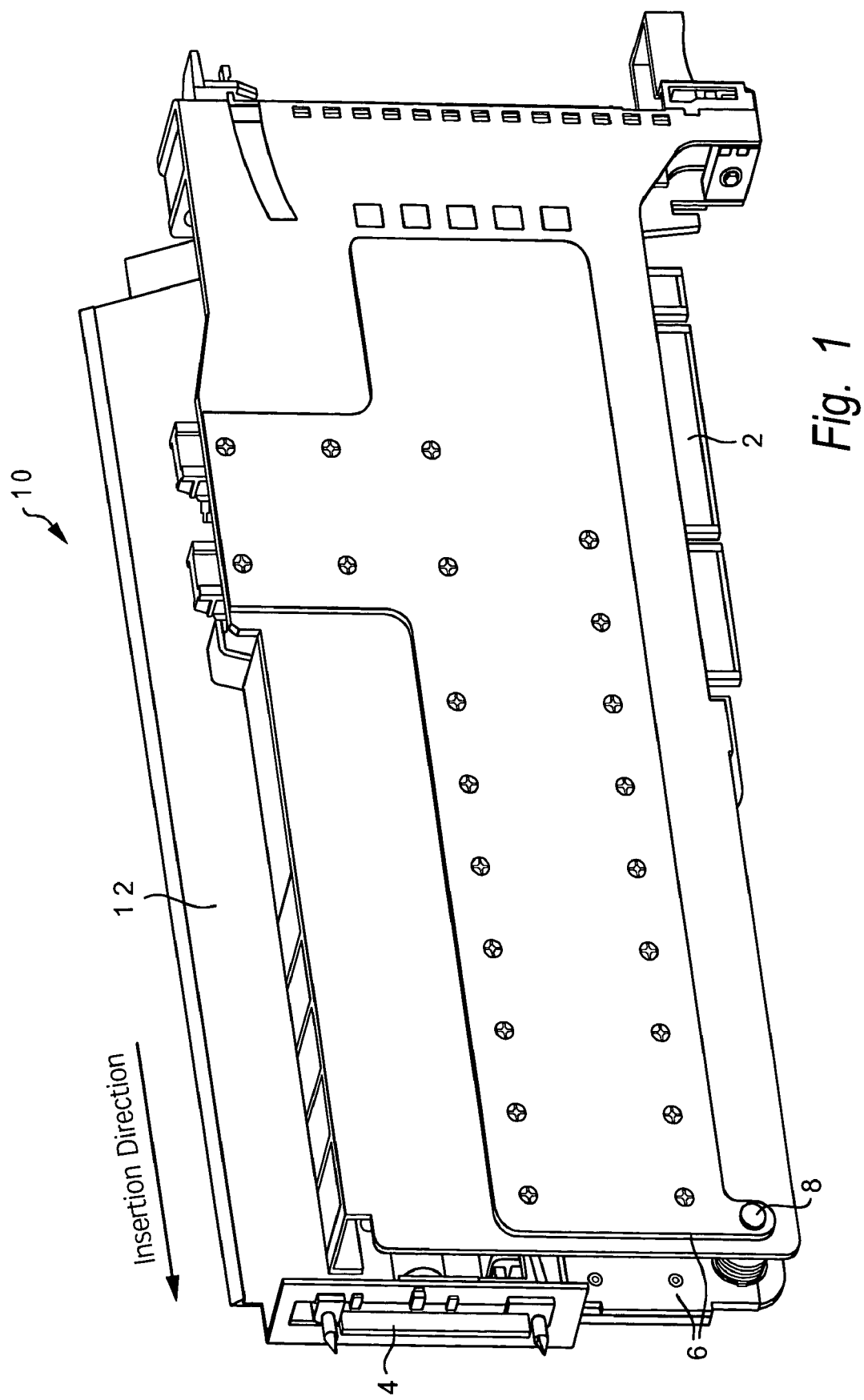
FIG. 1 is a perspective view depicting a card mounting apparatus in accordance with the present invention.
Figure 2:
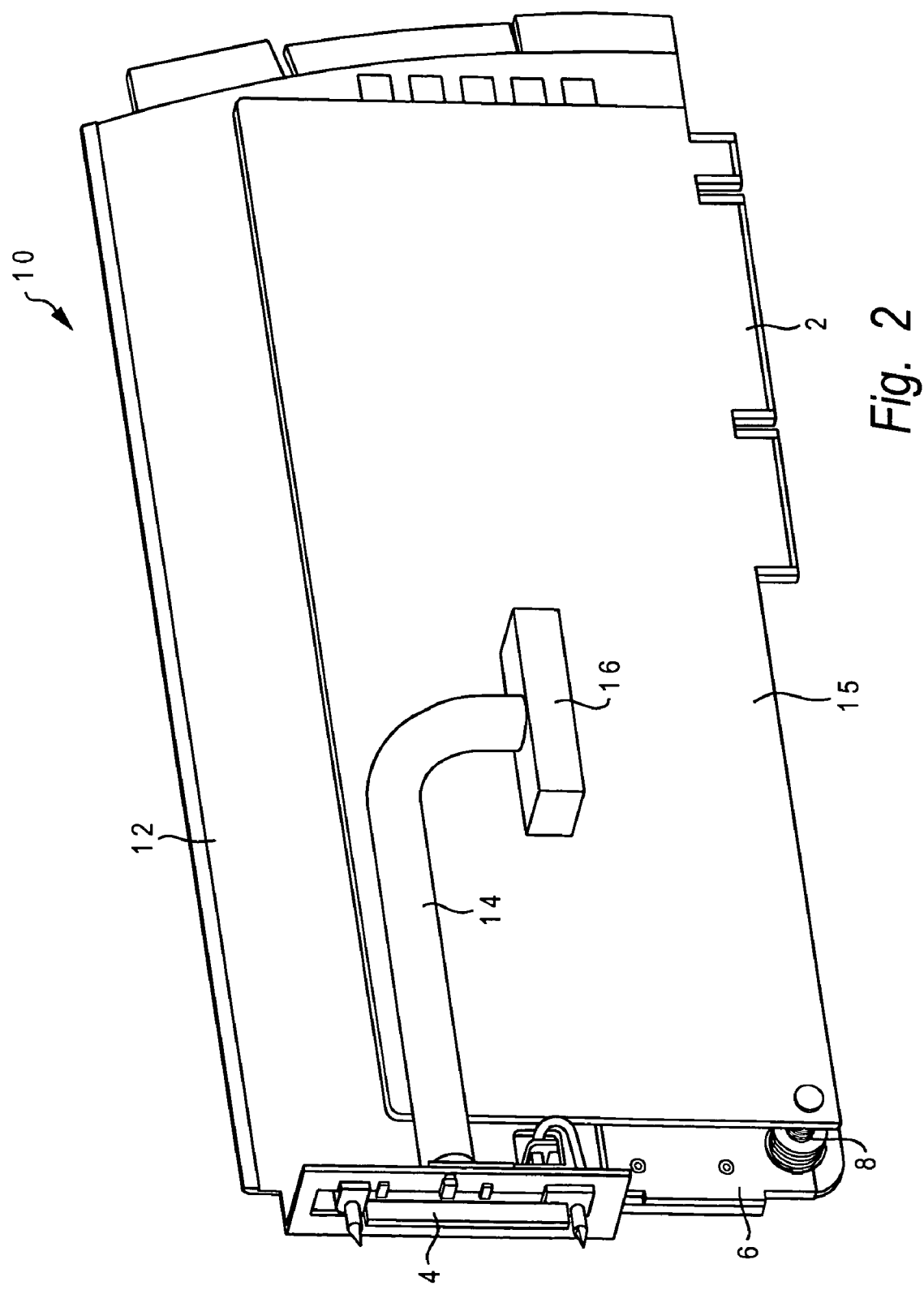
FIG. 2 is an alternate perspective view illustrating the card mounting apparatus of the present invention.
Figure 3:
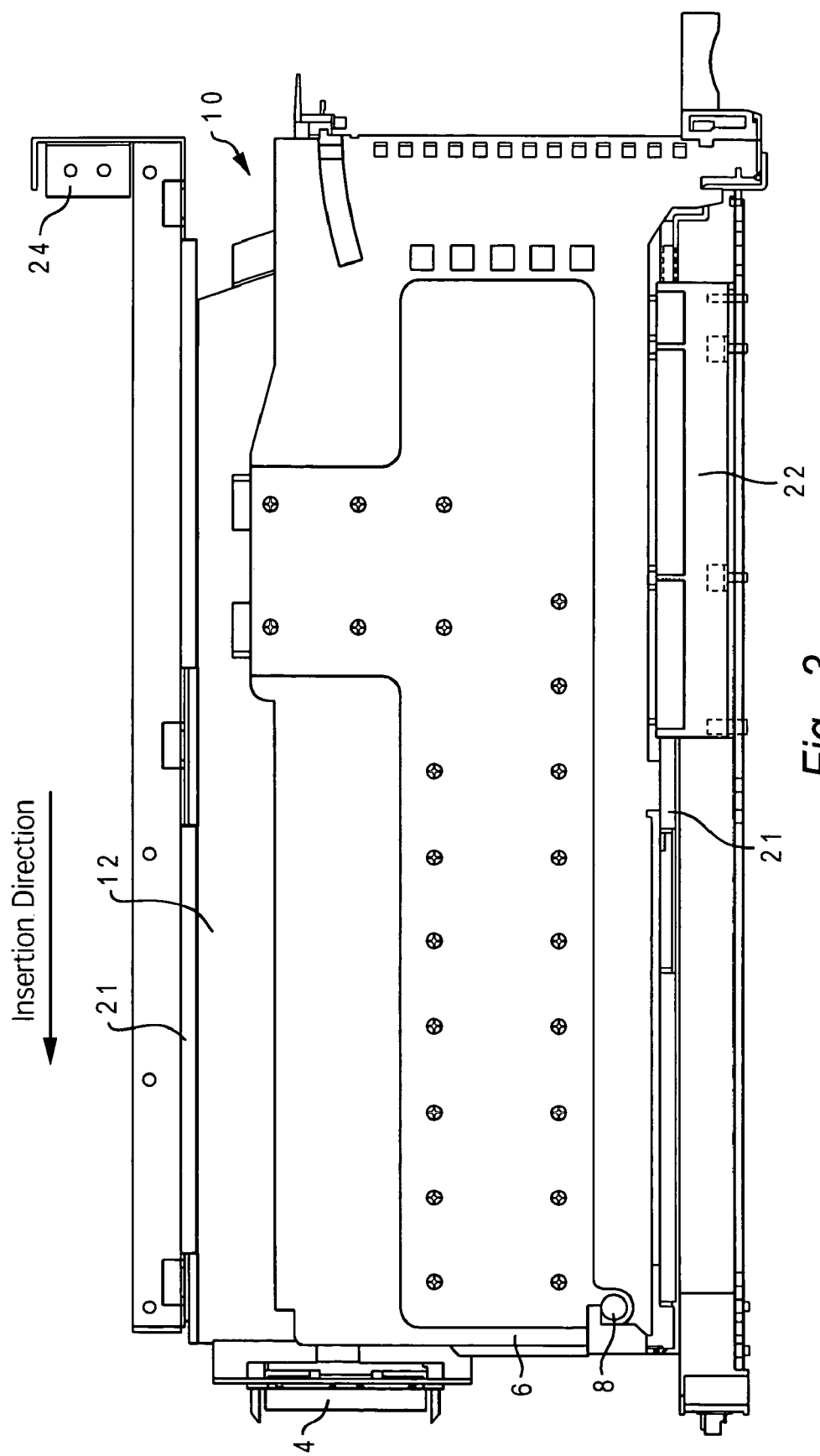
FIG. 3 is a side view depicting the card mounting apparatus of the present invention.
Figure 4:
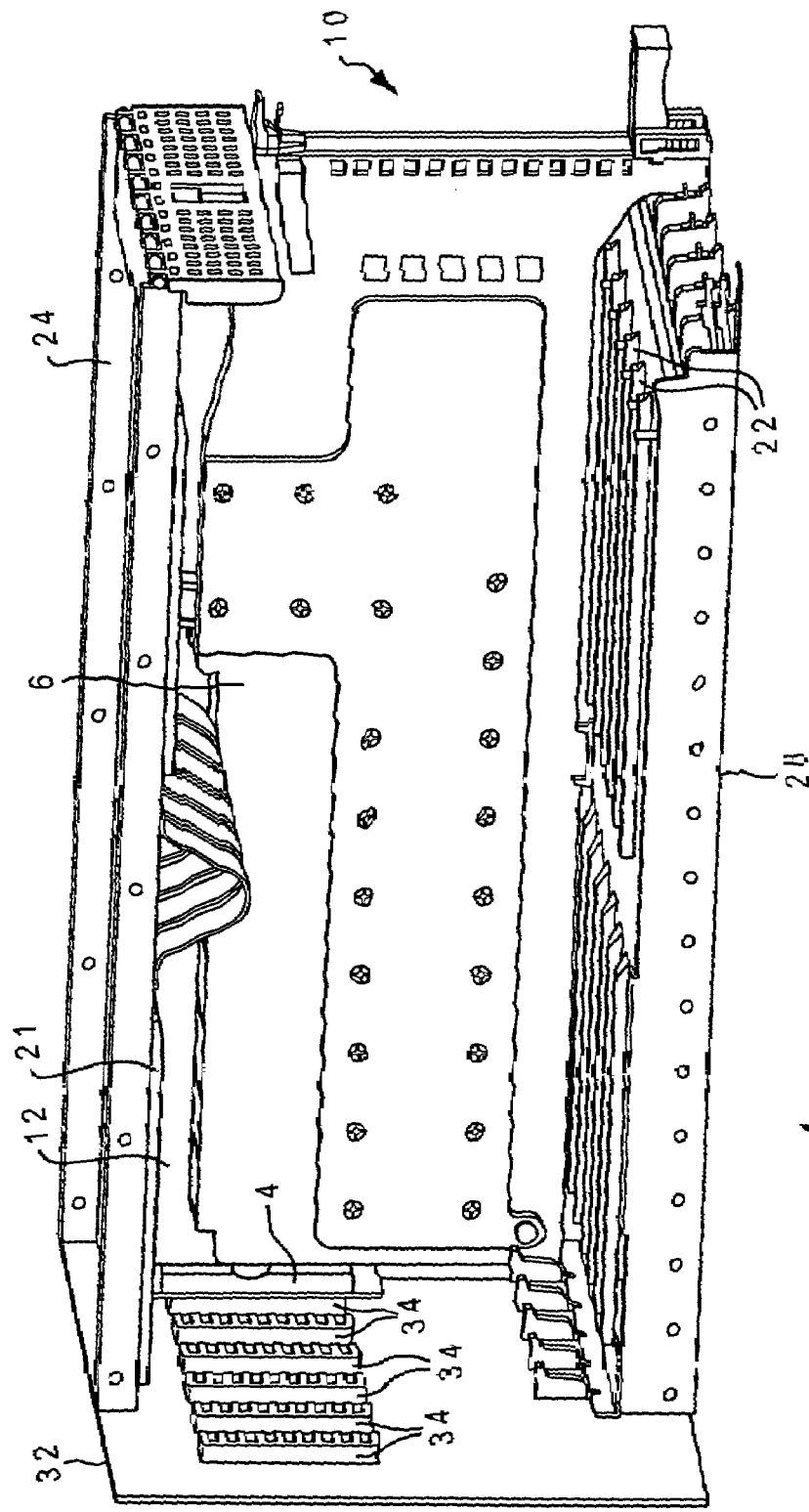
FIG. 4 is a perspective view illustrating a card mounting apparatus as deployed within a computer chassis bay in accordance with the present invention.

With reference to the figures, wherein like reference numerals refer to like and corresponding parts throughout, and in particular with reference to FIGS. 1 and 2, there are illustrated perspective views depicting a card mounting apparatus in accordance with the present invention. Referring to FIG. 1, the card mounting apparatus generally comprises a circuit card housing unit in the form of a blind swap cartridge 10. Blind swap cartridges, such as blind swap cartridge 10, generally serve as containment and mounting structures enabling a card contained therein to be installed in a computer chassis in a modular manner requiring minimal handwork. To this end, PCI card cartridge 10 preferably includes a housing body comprising enclosure members 6 forming an enclosure in which one or more cards are contained and a guide plate member 12, which as depicted in FIGS. 3 and 4, provides lateral bearing support for guiding the cartridge in proper alignment within a given chassis bay or port. Guide plate 12 and the card enclosure members 6 may be formed as an integral unit during manufacturing or may be mutually coupled such as by welding, soldering or other mechanical fastening means to form a discrete unit that when assembled share mutually fixed orientations.

The card mounting apparatus depicted in FIGS. 1 and 2 further includes features providing multi-directional signaling interface connection of a circuit card. As utilized herein, a "signaling interface" is equivalent to an internal or expansion bus interface and is fundamentally a collection of signal transmitters (e.g. conductors, fibre optical transmitters) through which data is transmitted from one part of a computer to another. Referring to FIG. 2, wherein blind swap cartridge 10 is depicted with a cartridge sidewall removed for display, the depicted embodiment further comprises a PCI card 15 contained within blind swap cartridge 10. PCI card 15 is a printed circuit card containing circuitry and bus structures conforming to the PCI standard. PCI card 15 further includes a first signal interface connector in the form of a PCI edge connector 2 for communicatively coupling the PCI card to a system PCI backplane (depicted in FIGS. 3 and 4). Edge connector 2 typically forms an extension of PCI card 15 that in inserted or "plugged" into a complementary chassis connector and generally includes a row of printed metallic tracks that provide the electrical connection.

As further depicted in FIGS. 1 and 2, PCI card 15 is mounted within an interior enclosure formed by enclosure members 6 and is supported at least in part by a pivot member 8 which may comprises a metal pin or similar feature that provides an axis about which PCI card 15 may be rotated. With enclosure members 6 fixed in relation to pivot member 8, PCI card 15 may pivot slightly to enable edge connector 2 to be exposed from the interior cartridge enclosure as shown in FIG. 1. In this manner, and assuming a very slight pivotal movement required for engaging PCI edge connector 2 into a backplane connector, PCI edge connector 2 is movable in a substantially linear manner from the depicted bottom open side of blind swap cartridge 10.

Significant to the principle of invention set forth herein, PCI card 15 is a multi-function card, meaning that it includes at least one other bus signaling interface in addition to having its native PCI circuitry and edge connector interfacing. In particular, PCI card 15 further includes devices operating in accordance with the SCSI standard and thus requires SCSI signaling interface connectivity from PCI card 15 to the system. To this end, the card mounting apparatus further includes a second signaling interface connector in the form of a SCSI connector 4 that is utilized for connecting the associated SCSI-related functions onboard PCI card 15 to a system planar. SCSI connector 4 is preferably constructed in accordance with the SCSI standard under which several connector designs are possible. As can be clearly seen in FIGS. 1 and 2, the connector engagement planes of SCSI connector 4 and PCI edge connector 2, defined by the direction in which each respective connector engages a complementary backplane connector, are mutually transverse. More specifically, and as illustrated in FIGS. 3 and 4, the SCSI connector 4 is disposed on blind swap cartridge 10 such that its engagement plane is aligned with the cartridge insertion direction while PCI edge connector 2 is positioned such that its engagement plane (i.e. direction that it engages a backplane connector) is transverse to the cartridge insertion direction.

In accordance with the present invention, SCSI connector 4 is rigidly affixed to the exterior of blind swap cartridge 10, preferably attached to guide plate 12. Therefore, due to the aforementioned movability of PCI edge connector 2, the PCI edge connector 2 is also movable with respect to the rigidly affixed SCSI connector 4. In an important feature of the exemplary embodiment, the depicted card mounting apparatus further includes a flexible interconnect member in the form of a SCSI cable 14 that couples SCSI connector 4 to PCI card 15. SCSI cable 14 may be soldered to or plug connected via a third signaling interface connector 16 to PCI card 15. As depicted in FIGS. 3 and 4, the flexibility or "play" provided by SCSI cable 14 advantageously enables PCI card 15 to move slightly with respect the blind swap cartridge 10 while preserving the benefits of maintaining the cartridge insertion aligned SCSI connector 4 to remain fixed and thus facilitate the blind swap functionality of the cartridge.

With reference to FIGS. 3 and 4, there is depicted a side view and a perspective view, respectively, illustrating the card mounting apparatus as deployed within a computer chassis bay in accordance with the present invention. Specifically, blind swap cartridge 10 is shown inserted into a chassis structure 24 generally defined as having chassis guide rails 21 that engage guide plate 12 to guide blind swap cartridge 10 in the depicted cartridge insertion direction into a particular bay. The cartridge bays within chassis structure 24 are defined by a PCI backplance 28 having multiple PCI edge connectors 22, and a SCSI backplane card 32 on which are mounted multiple SCSI backplane connectors 34. In the manner depicted in FIGS. 3 and 4, when blind swap cartridge 10 is inserted into a chassis bay, SCSI connector 4 directly engages a complementary one of SCSI backplane connectors 34 when the cartridge has been fully inserted but just prior to PCI card 15 rotating slightly downward (automatically or responsive to a suitable actuation mechanism) into an aligned one of PCI chassis edge connectors 22.

In the manner shown in FIGS. 3 and 4, the mounting apparatus of the present invention enables a blind swap cartridge supporting a printed circuit card having two or more signaling interfaces to be installed in a compact, multi-bay chassis without the need for additional cabling which would otherwise substantially defeat the intended purpose of blind swapping printed circuit cards. Regarding the depicted embodiments, it should be noted that while the present invention is particularly suitable for PCI printed circuit cards having both PCI and SCSI signaling interconnects, the principles of the present invention are more generally applicable to any printed circuit card carrier or signaling interface type.

While the invention has been particularly shown and described with reference to a preferred embodiment, it will be understood by those skilled in the art that various changes in form and detail may be made therein without departing from the spirit and scope of the invention.

What is claimed is:

1. A card mounting apparatus comprising:
   a housing unit containing a printed circuit card, having a signaling interface edge connector that is movable with respect to said housing unit wherein said printed circuit card is pivotally mounted within said housing unit such that said printed circuit card is pivotally movable to expose said signaling interface edge connector from outside the housing unit in a substantially transverse direction relative to an insertion direction in which said housing unit is inserted for docking within a computer chassis, and;
   a second signaling interface connector rigidly affixed to the housing unit, wherein said signaling interface edge connector is disposed substantially transversely with respect to said second signaling interface edge connector; and
   a flexible interconnect member coupling the second signaling interface connector to the printed circuit board.

2. The card mounting apparatus of claim 1, wherein said housing unit is modularly installed within the computer chassis in a substantially linear module installation direction and wherein the second signaling interface connector has a connector engagement plane aligned with the module installation direction.

3. The card mounting apparatus of claim 1, wherein the signaling interface edge connector is rigidly affixed to the circuit card and wherein said circuit card is movable with respect to said housing unit.

4. The card mounting apparatus of claim 1, wherein said flexible interconnect member comprises a flexible cable.

5. The card mounting apparatus of claim 1, further comprising a third signaling interface connector coupling said flexible interconnect member to the printed circuit card.

6. The card mounting apparatus of claim 1, wherein said printed circuit card is a PCI card.

7. The card mounting apparatus of claim 6, wherein said signaling interface edge connector comprises a PCI card edge connector.

8. The card mounting apparatus of claim 1, wherein said housing unit comprises a circuit card cartridge.

9. The card mounting apparatus of claim 8, wherein said circuit card cartridge includes a guide member for guiding the circuit card cartridge into a chassis bay within the computer chassis, said second signaling interface connector rigidly affixed to said guide member.

10. An apparatus for providing multi-directional signaling interface connection of a circuit card, said apparatus comprising:
    a blind swap cartridge carrying a circuit card that includes a first signaling interface connector which is movable with respect to said blind swap cartridge in a substantially transverse direction relative to an insertion direction of said blind swap cartridge into a computer chassis;
    a second signaling interface connector rigidly affixed to the exterior of said blind swap cartridge, said second signaling interface connector having a connector engagement plane substantially aligned with the blind swap cartridge insertion direction; and
    a flexible interconnect member coupling the second signaling interface connector to the circuit card.

11. The apparatus of claim 10, wherein said flexible interconnect member comprises a flexible cable.

* * * * *